United States Patent
Ferguson

(10) Patent No.: US 9,350,364 B1
(45) Date of Patent: May 24, 2016

(54) PHASE-LOCKED LOOP CIRCUIT HAVING LOW CLOSE-IN PHASE NOISE

(71) Applicant: Adtran, Inc., Huntsville, AL (US)

(72) Inventor: Jason R. Ferguson, Mesa, AZ (US)

(73) Assignee: Adtran, Inc., Huntsville, AL (US)

( * ) Notice: Subject to any disclaimer, the term of this patent is extended or adjusted under 35 U.S.C. 154(b) by 0 days.

(21) Appl. No.: 14/680,174

(22) Filed: Apr. 7, 2015

(51) Int. Cl.
*H03L 7/24* (2006.01)
*H03L 7/097* (2006.01)
*H03L 7/099* (2006.01)
*H03B 5/32* (2006.01)
*H03L 7/093* (2006.01)
*H03B 27/00* (2006.01)
*H03L 7/00* (2006.01)

(52) U.S. Cl.
CPC ...... *H03L 7/097* (2013.01); *H03B 5/32* (2013.01); *H03B 27/00* (2013.01); *H03L 7/00* (2013.01); *H03L 7/093* (2013.01); *H03L 7/099* (2013.01); *H03L 7/0991* (2013.01)

(58) Field of Classification Search
CPC ........ H03B 27/00; H03L 7/00; H03L 7/0991; H03L 7/093

USPC ............... 331/2, 46, 55, 34; 327/156, 159
See application file for complete search history.

(56) References Cited

U.S. PATENT DOCUMENTS

2009/0121792 A1* 5/2009 Travis ............... G06F 1/025
331/2

* cited by examiner

*Primary Examiner* — Arnold Kinkead
(74) *Attorney, Agent, or Firm* — Smith Tempel Blaha LLC; Michael J. Tempel

(57) ABSTRACT

Phase-locked loop (PLL) circuits and methods of operation are disclosed. At frequencies that are closer to a center frequency, the phase noise characteristics contributed by a crystal oscillator in a first PLL sub-circuit dominate over the phase noise characteristics contributed by a second PLL sub-circuit, resulting in low close-in phase noise in the overall PLL circuit output signal, while at frequencies farther from the center frequency, the phase noise characteristics contributed by the second PLL sub-circuit dominate over the phase noise characteristics contributed by the crystal oscillator in the first PLL sub-circuit, resulting in low phase noise in the overall PLL circuit output signal at those frequencies.

17 Claims, 5 Drawing Sheets

PHASE-LOCKED LOOP CIRCUIT HAVING LOW CLOSE-IN PHASE NOISE

BACKGROUND

A phase-locked loop (PLL) is a control system that generates an output signal having a phase and frequency derivative that is locked in fixed relation to an input signal. A PLL commonly includes a phase error detector, a low-pass loop filter, and a voltage-controlled oscillator (VCO). An input of the loop filter is coupled to an output of the phase error detector. An input of the VCO is coupled to an output of the loop filter. A first input of the phase error detector receives the input signal. A second input of the phase error detector is coupled to the output of the VCO to feed the output signal back to the phase error detector. A PLL may include any combination of analog and digital circuitry. An all-digital PLL (ADPLL) may include a numerically controlled oscillator (NCO) rather than a VCO, a digital loop filter, and an exclusive-OR phase error detector.

PLLs are commonly included in oscillator circuitry, among other types of circuitry. For example, a PLL may be used in a communications receiver circuit that recovers a clock signal from a received signal carrying both clock and data information.

The term "phase noise" refers to frequency-domain measurement of fluctuations in the phase of a signal caused by time-domain instabilities of the type commonly referred to as "jitter." The term "close-in phase noise" refers to phase noise at a low frequency offset from the carrier frequency and outside the 1/f "flicker" noise, such as, for example, between 1 Hz and 1 kHz from the carrier frequency. In many types of circuitry, close-in phase noise does not present a problem. For example, common digital communications circuitry, such as a synchronous optical networking (SONET) receiver, is sensitive to phase noise (or jitter) in the 12 kHz to 20 MHz range. For this reason, manufacturers of oscillator circuits commonly sacrifice close-in phase noise to obtain low phase noise in the 12 kHz to 20 MHz range.

Some digital communications technologies, such as the Digital Subscriber Line (DSL), operate in frequency ranges above about 50 MHz. For example, although DSL circuitry may employ any of a number of reference frequencies, one commonly employed DSL reference frequency is 70.656 MHz. Some of these communications technologies, including DSL, rely on accurate analog-to-digital conversion. To provide such analog-to-digital conversion, DSL circuitry may require high frequency (e.g., greater than 50 MHz) PLL-based oscillator circuitry with low close-in phase noise. More specifically, very accurate clock signals, i.e., having good signal to noise ratio, at frequencies close to the carrier or center frequency, are required to recover the data. However, commercially available oscillator circuits that are configurable to operate in a specified frequency band (e.g., DSL) commonly have undesirably high close-in phase noise.

Crystal oscillators capable of generating high frequencies (greater than, for example, 50 MHz) are known as third-overtone crystal oscillators because they resonate at three times their fundamental frequencies. However, third-overtone crystal oscillators suffer from poor close-in phase noise performance. Fundamental-mode crystal oscillators, which resonate at their fundamental frequency, have better close-in phase noise performance than third-overtone crystal oscillators. However, fundamental-mode crystal oscillators are generally not capable of generating high frequencies (greater than, for example, 50 MHz). (This is because resonant frequency is inversely proportional to crystal thickness, and present manufacturing processes cannot handle extremely thin crystals.) A further consideration is that fundamental-mode crystal oscillators are generally not commercially available in, for example, the specific reference frequencies required (e.g., the above-referenced 70.656 MHz DSL reference frequency). Rather, such oscillators are commercially available in a small number of generic frequencies, with the understanding that the oscillator output signal can be multiplied (or divided) in frequency if desired. However, multiplying the output frequency of an oscillator can increase close-in phase noise.

SUMMARY

Embodiments of the invention relate to phase-locked loop (PLL) circuits and methods of operation of the circuits. At frequencies that are closer to a center frequency, the phase noise characteristics contributed by a crystal oscillator in a first PLL sub-circuit dominate over the phase noise characteristics contributed by a second PLL sub-circuit, resulting in low close-in phase noise in the overall PLL circuit output signal, while at frequencies farther from the center frequency, the phase noise characteristics contributed by the second PLL sub-circuit dominate over the phase noise characteristics contributed by the crystal oscillator in the first PLL sub-circuit, resulting in low phase noise in the overall PLL circuit output signal at those frequencies.

In an exemplary embodiment, a PLL circuit comprises a crystal oscillator, a first PLL sub-circuit, and a second PLL sub-circuit. The first PLL sub-circuit includes a first PLL and a numerically controlled oscillator (NCO). A first input of the first PLL is configured to receive an input signal to which the output of the PLL circuit is to be locked. A second input of the first PLL is configured to receive a feedback signal. A signal input of the NCO is coupled to an output of the first PLL, and a control input of the NCO is coupled to an output of the crystal oscillator. The second PLL sub-circuit includes a second PLL. An input of the second PLL sub-circuit is coupled to an output of the NCO. An output of the second PLL sub-circuit provides the feedback signal to the second input of the first PLL.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
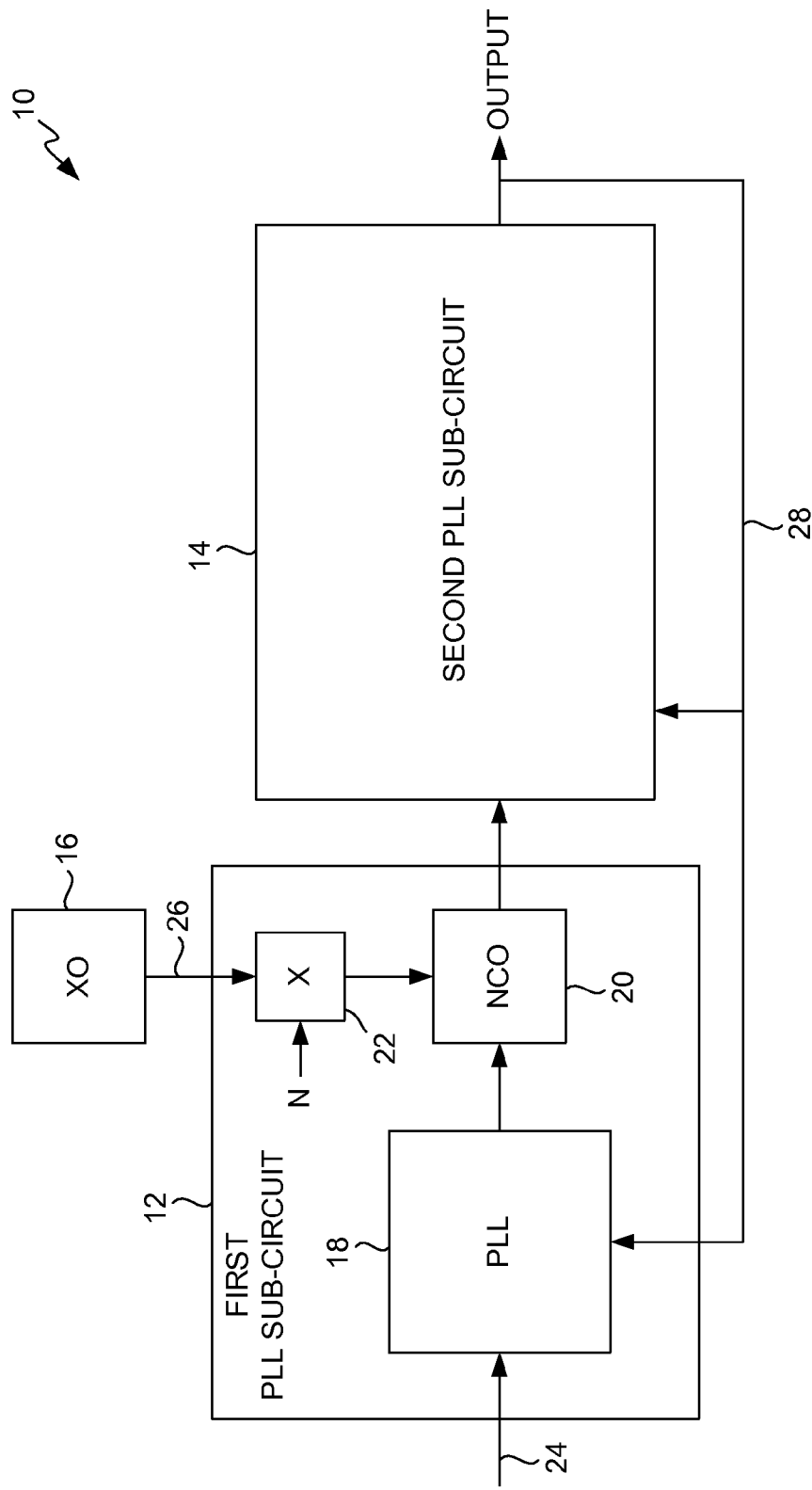
FIG. 1 is a block diagram of a PLL circuit, in accordance with an exemplary embodiment of the invention.

As illustrated in FIG. 1, in an illustrative or exemplary embodiment of the invention, a PLL circuit 10 includes a first PLL sub-circuit 12, a second PLL sub-circuit 14, and a crystal oscillator (XO) 16. First PLL sub-circuit 12 includes a first PLL 18, a numerically controlled oscillator (NCO) 20, and a multiplier 22. One input of first PLL 18 (which is also the input of first PLL sub-circuit 12) is configured to receive an input signal 24. As will become more apparent from the descriptions below, PLL circuit 10 is configured to remove the undesirable effects of jitter in input signal 24. PLL circuit 10 can be used, for example, to drive circuitry (not shown) that requires a low-jitter input clock signal. An example of such circuitry that requires a low-jitter input clock signal or, more specifically, a low close-in phase noise clock signal, is DSL circuitry.

Another input of first PLL 18 is configured to receive a feedback signal 28 generated by second PLL sub-circuit 14. A signal input of NCO 20 is coupled to the output of first PLL 18. A control input of NCO 20 is coupled to an output of XO 16 via multiplier 22. XO 16 is a free-running fundamental mode oscillator that generates an oscillator signal 26. An input of multiplier 22 is coupled to the output of XO 16 that provides oscillator signal 26. The output of multiplier 22 is coupled to the control input of NCO 20. First PLL sub-circuit 12 is thus configured to operate as an all-digital PLL (ADPLL) with frequency multiplication.

In operation, multiplier 22 multiplies the frequency of oscillator signal 26 by a number N, which can be any suitable number. For example, XO 16 can generate an oscillator signal 26 having a frequency of 25 MHz, which multiplier 22 can multiply by eight (i.e., N=8 in this example), yielding a frequency of 200 MHz with which NCO 20 is controlled. In view of the descriptions herein, persons skilled in the art will be capable of selecting the number N in other embodiments. In still other embodiments, multiplier 22 can be omitted if an XO having a sufficiently high frequency can be provided.

The output of NCO 20 (which is the output of first PLL sub-circuit 12) is coupled to a signal input of second PLL sub-circuit 14. The output of second PLL sub-circuit 14 defines the output of PLL circuit 10. The output of second PLL sub-circuit 14 also provides the above-referenced feedback signal 28.

Figure 2:
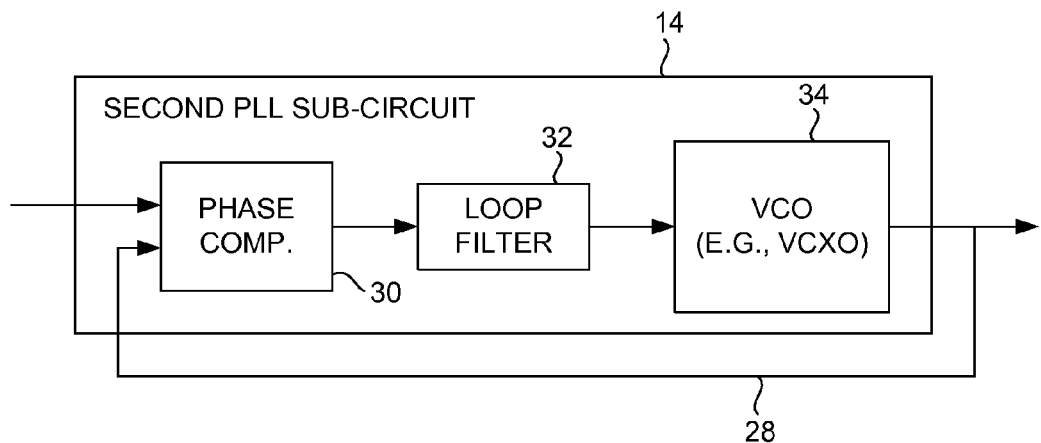
FIG. 2 is a block diagram of the second PLL sub-circuit of the PLL circuit of FIG. 1.

As illustrated in FIG. 2, second PLL sub-circuit 14 includes a phase error detector or phase comparator 30, a loop filter 32, and a voltage-controlled oscillator (VCO) 34. An input of loop filter 32 is coupled to an output of phase comparator 30. An input of VCO 34 is coupled to an output of loop filter 32. A first input of phase comparator 30 is coupled to the output of first PLL sub-circuit 12 (i.e., the output of NCO 20). The output of VCO 34 is coupled to a second input of phase comparator 30 to provide feedback signal 28 to phase comparator 30. The output of VCO 34 defines the output of second PLL sub-circuit 14. Phase comparator 30 can comprise, for example, exclusive-OR logic, or other suitable phase comparator circuitry. Loop filter 32 can comprise, for example, an analog low-pass filter (LPF).

Figure 3:
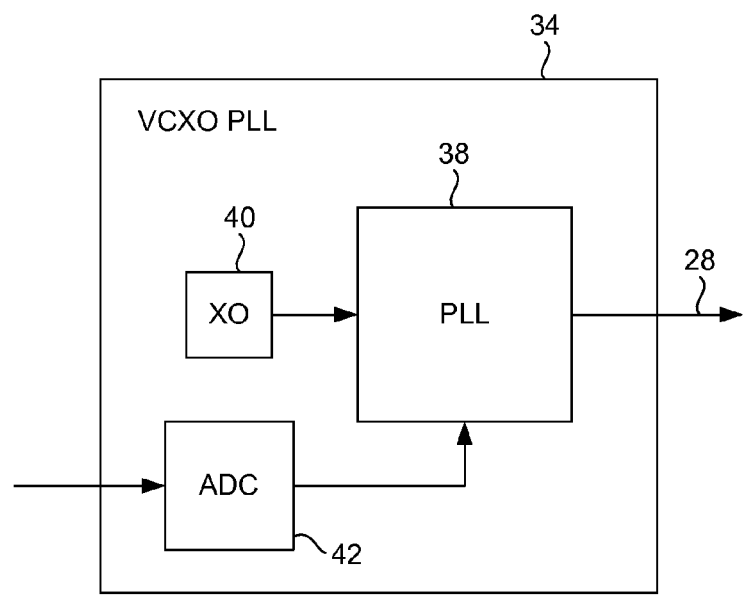
FIG. 3 is a block diagram of the VCXO PLL of the second PLL sub-circuit of the PLL circuit of FIG. 2.

As illustrated in FIG. 3, VCO 34 can include, for example, a PLL 38, an XO 40, and an analog-to-digital converter (ADC) 42. The signal input of PLL 38 is coupled to the output of XO 40. The feedback or control input of PLL 38 is coupled to the output of ADC 42. The input of ADC 42 is coupled to the output of loop filter 32 (FIG. 2). This circuit arrangement functions as a voltage-controlled crystal oscillator (VCXO). PLL 38 can be of any type having sufficient bandwidth, as will become more apparent from the following descriptions.

Referring again to FIG. 1, in operation, oscillator signal 26 has extremely low phase noise at frequencies close to its center frequency (e.g., 25 MHz in the example described above), i.e., low "close-in phase noise," but greater phase noise at frequencies farther from the center frequency, i.e., "far-out phase noise." The operation of multiplier 22 inherently introduces additional far-out phase noise.

Although the ADPLL configuration of first PLL sub-circuit 12 provides the benefit of maintaining the low close-in phase noise that is characteristic of XO 16, the operation of NCO 20 inherently introduces jitter. As well understood by persons skilled in the art, NCO 20 comprises counter circuitry (not separately shown). The number of input clock cycles that cause the counter circuitry to generate one output pulse can vary randomly by one clock cycle in response to jitter. A random variation of one cycle of oscillator signal 26 corresponds to as much as one clock period of oscillator signal 26 of jitter in the output of NCO 20. In an example in which XO 16 generates a 25 MHz oscillator signal 26, the output of NCO 20 can have as much as 5 ns of jitter. However, this jitter is high frequency compared with the frequency at which a comparable PLL circuit might conventionally operate. This characteristic is leveraged in second PLL sub-circuit 14, which readily can be configured to filter out such high frequency jitter while preserving the low close-in phase noise characteristics of XO 16.

Referring again to FIG. 2, loop filter 32 can be configured to have a wide or high bandwidth, up to the limit at which second PLL sub-circuit 14 would become unstable. In an embodiment in which VCO 34 is a VCXO, the bandwidth of loop filter 32 (i.e., an LPF) can be as great as (i.e., substantially equal to) the VCXO modulation bandwidth, which is the rate at which the output frequency can track the input voltage change. The wide bandwidth of loop filter 32 filters out the above-described high frequency jitter in the output of NCO 20 while preserving the low close-in phase noise. Maximizing the bandwidth of loop filter 32 in this manner may seem counterintuitive because in a conventional PLL circuit configured to remove typical low frequency jitter from a clock signal, conventional wisdom dictates minimizing loop bandwidth. However, a low-bandwidth PLL loop filter could introduce close-in phase noise.

Figure 4:
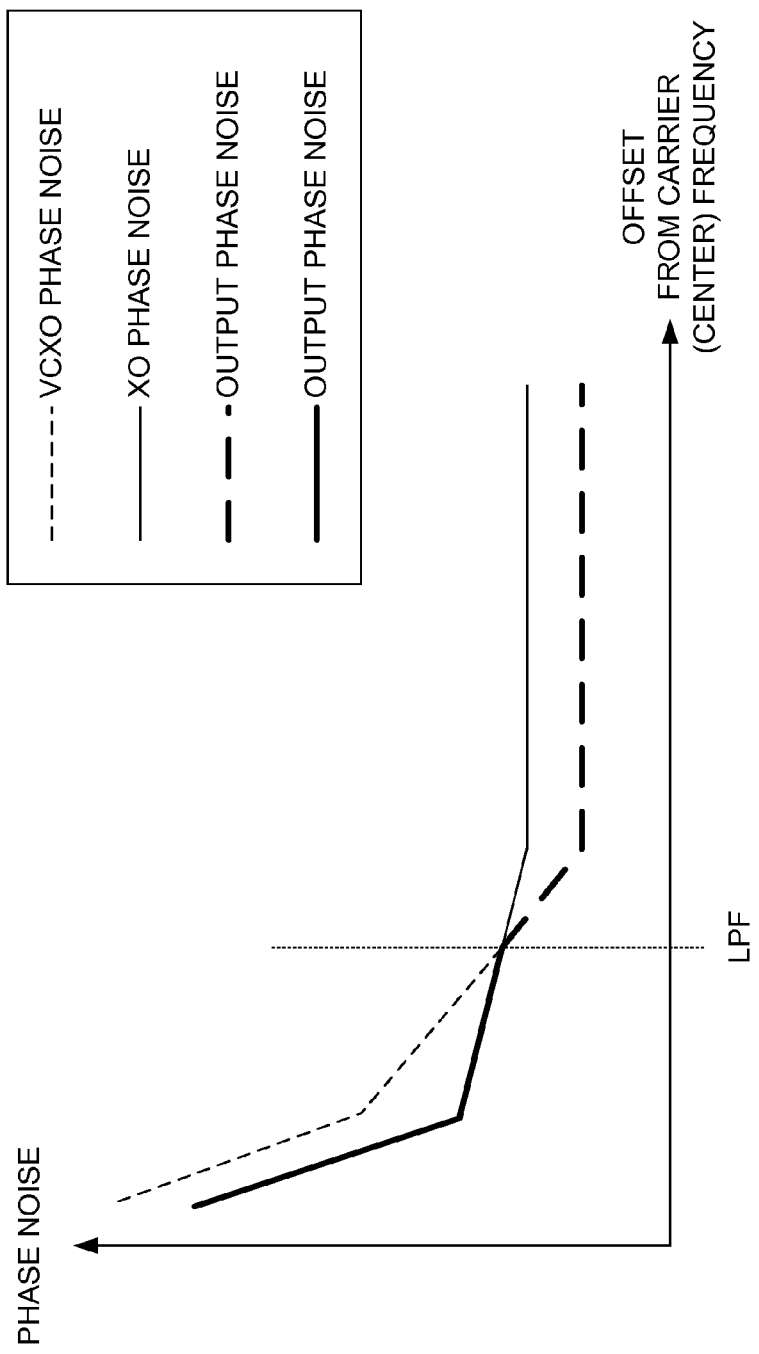
FIG. 4 is a plot of phase noise versus frequency.

In FIG. 4, an example of the phase noise in the output signal of PLL circuit 10 is indicated in heavy (solid as well as broken) line. The phase noise in the output of XO 16 (i.e., in oscillator signal 26), which is indicated in solid (light as well as heavy) line, dominates the phase noise in the output signal of PLL circuit 10 at frequencies less than the cut-off frequency of loop filter 32 (i.e., a LPF). The phase noise in the output of VCO 34 (i.e., feedback signal 28), which is indicated in broken (light as well as heavy) line, dominates the phase noise in the output signal of PLL circuit 10 at frequencies greater than the cut-off frequency of loop filter 32 (i.e., a LPF). Stated another way, employing XO 16 as a frequency reference for first PLL sub-circuit 12 provides the advantage of low close-in phase noise, while providing second PLL sub-circuit 14 with a high bandwidth preserves that low close-in phase noise but filters out the high frequency jitter contributed by NCO 20 as well as far-out phase noise.

Figure 5:
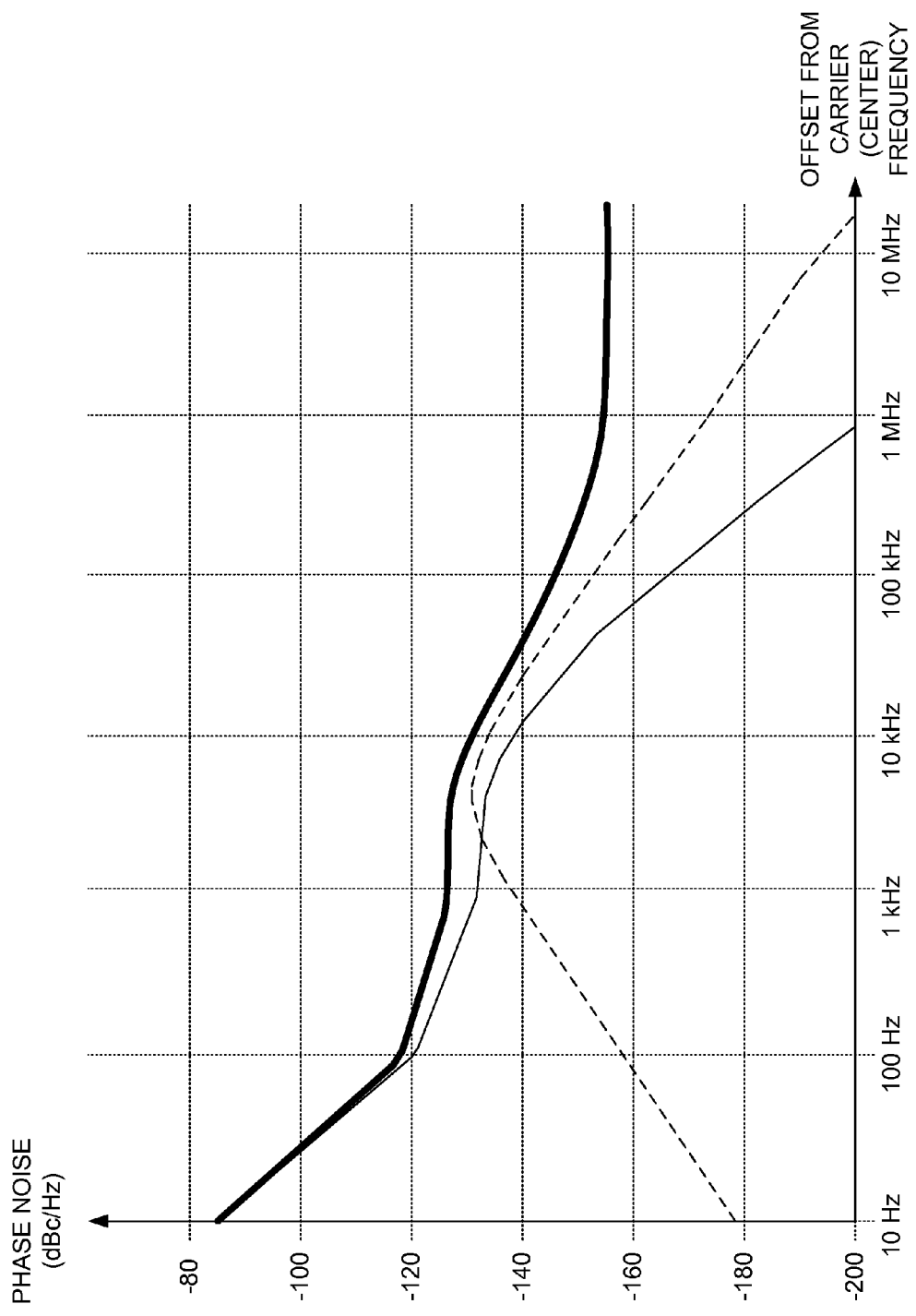
FIG. 5 is similar to FIG. 4.
Figure 6:
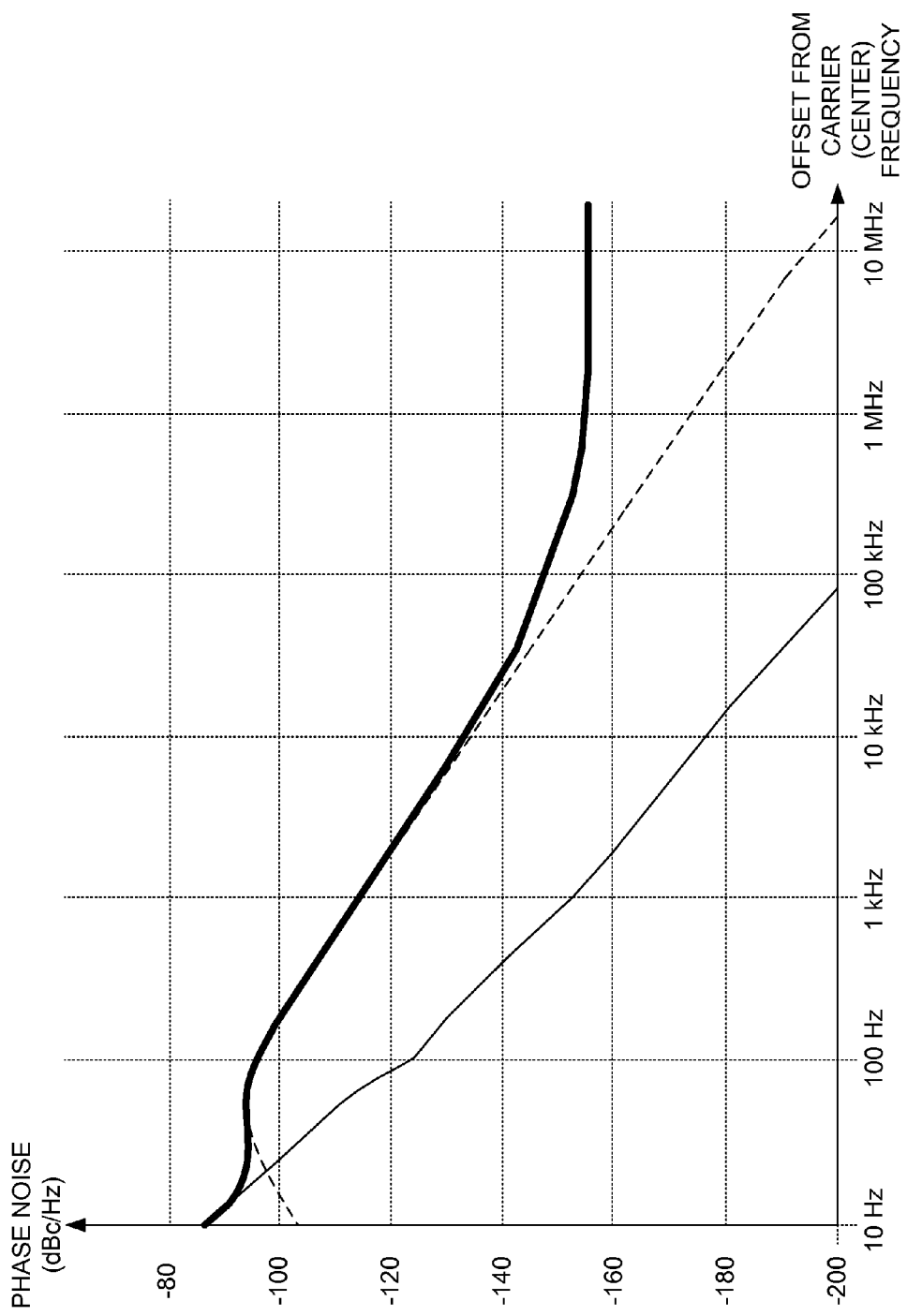
FIG. 6 is similar to FIGS. 4-5.

The effect of configuring loop filter 32 to have a high bandwidth can be further appreciated with reference to FIGS. 5 and 6. In FIGS. 5 and 6 the phase noise in the output of PLL circuit 10 is indicated in solid heavy line, while the phase noise contribution of XO 16 (i.e., oscillator signal 26) is indicated in solid lighter line, and the phase noise contribution of VCO 34 (i.e., feedback signal 28) is indicated in broken line. The only difference between FIG. 5 and FIG. 6 is that FIG. 5 represents an embodiment in which loop filter 32 is configured to have a high bandwidth substantially equal to the VXCO (i.e., VCO 34) modulation bandwidth (such as, for example, 8 kHz), while FIG. 6 represents an embodiment in which loop filter 32 is configured to have a low bandwidth (such as, for example, 100 Hz). It can be observed that the level of close-in phase noise (e.g., between approximately 1 Hz and 1 kHz) in the output signal of PLL circuit 10 in FIG. 5 is much lower than the level of close-in phase noise in the output signal of PLL circuit 10 in FIG. 6.

One or more illustrative or exemplary embodiments of the invention have been described above. However, it is to be understood that the invention is defined by the appended claims and is not limited to the specific embodiments described.

What is claimed is:

1. A phase-locked loop (PLL) circuit for operating upon an input signal, comprising:
    a crystal oscillator (XO) having an output configured to produce an XO signal distinct from the input signal;
    a first PLL sub-circuit comprising a first PLL and a numerically controlled oscillator (NCO), the first PLL having a first input configured to receive the input signal and a second input configured to receive a feedback signal, the NCO having an NCO signal input coupled to an output of the first PLL and a NCO control input coupled to the output of the XO; and
    a second PLL sub-circuit comprising a second PLL, the second PLL sub-circuit having a first input coupled to an output of the NCO and having a second input configured to receive the feedback signal, the second PLL sub-circuit having an output defining the feedback signal.

2. The PLL circuit of claim 1, wherein the second PLL sub-circuit comprises a phase error detector, a loop filter, and a voltage-controlled oscillator (VCO), the loop filter having an input coupled to an output of the phase error detector, the VCO having an input coupled to an output of the loop filter, the phase error detector having a first input coupled to the output of the NCO and a second input coupled to an output of the VCO and coupled to the second input of the first PLL.

3. The PLL circuit of claim 2, wherein the phase error detector comprises exclusive-OR logic.

4. The PLL circuit of claim 2, wherein the VCO comprises a voltage-controlled crystal oscillator (VCXO).

5. The PLL circuit of claim 4, wherein the VCXO has a phase noise level exceeding a phase noise level of the XO within a frequency band.

6. The PLL circuit of claim 4, wherein the loop filter comprises a low-pass filter having a bandwidth substantially equal to a VCXO modulation bandwidth.

7. The PLL circuit of claim 1, wherein the first PLL consists of all-digital logic.

8. The PLL circuit of claim 1, wherein the first PLL has a bandwidth less than 1 Hz.

9. The PLL circuit of claim 1, wherein the first PLL further comprises a frequency multiplier having an input coupled to an output of the XO and having an output coupled to the NCO control input.

10. A method for operation of a phase-locked loop (PLL) circuit, the PLL circuit comprising a crystal oscillator (XO), a first PLL sub-circuit, and a second PLL sub-circuit, the first PLL sub-circuit comprising a first PLL and a numerically controlled oscillator (NCO), the first PLL having a first input configured to receive an input signal and a second input configured to receive a feedback signal, the NCO having an NCO signal input coupled to an output of the first PLL and a control input coupled to an output of the crystal oscillator, the second PLL sub-circuit comprising a second PLL, the second PLL sub-circuit comprising a phase error detector, a low-pass filter, and a voltage-controlled crystal oscillator (VCXO), the low-pass filter having an input coupled to an output of the phase error detector, the VCXO having an input coupled to an output of the low-pass filter, the phase error detector having a first input coupled to the output of the NCO and a second input coupled to an output of the VCXO, the method comprising:
    the first PLL sub-circuit receiving an input signal and locking the input signal to a frequency of the XO; and
    the second PLL sub-circuit providing an output signal having a first phase noise characteristic corresponding to a phase noise characteristic of the XO at frequencies below a cutoff frequency of the low-pass filter, and providing the output signal with a second phase noise characteristic corresponding to a phase noise characteristic of the VCXO at frequencies above the cutoff frequency of the low-pass filter.

11. The method of claim 10, wherein the second PLL sub-circuit generating an output signal comprises the phase error detector performing an exclusive-OR logic operation.

12. The method of claim 10, wherein the VCXO has a phase noise level exceeding a phase noise level of the XO within a frequency band.

13. The method of claim 12, wherein the low-pass filter has a bandwidth substantially equal to a VCXO modulation bandwidth.

14. The method of claim 10, wherein the first PLL consists of all-digital logic.

15. The method of claim 10, wherein the first PLL has a bandwidth less than 1 Hz.

16. The method of claim 10, wherein the first PLL sub-circuit further multiplies a frequency of an XO signal and provides a multiplied signal to the NCO control input.

17. The PLL circuit of claim 4, wherein:
    the loop filter comprises a low-pass filter;
    the second PLL sub-circuit is configured to generate an output signal having a first phase noise characteristic corresponding to a phase noise characteristic of the XO at frequencies below a cutoff frequency of the low-pass filter, and providing the output signal with a second phase noise characteristic corresponding to a phase noise characteristic of the VCXO at frequencies above the cutoff frequency of the low-pass filter.

* * * * *